(12) United States Patent
Kurita et al.

(10) Patent No.: US 7,245,014 B2
(45) Date of Patent: Jul. 17, 2007

(54) SEMICONDUCTOR LIGHT EMITTING APPARATUS AND METHOD FOR PRODUCING THE SAME

(75) Inventors: Kenichi Kurita, Kitakatsuragi (JP); Nobumasa Kaneko, Kitakatsuragi (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/848,579

(22) Filed: May 19, 2004

(65) Prior Publication Data

US 2004/0238829 A1  Dec. 2, 2004

(30) Foreign Application Priority Data

May 20, 2003 (JP) ............................. 2003-142551
Apr. 16, 2004 (JP) ............................. 2004-122352

(51) Int. Cl.
*H01L 23/48* (2006.01)

(52) U.S. Cl. ...................... 257/739; 257/775; 257/777; 257/787; 257/926

(58) Field of Classification Search ..................... None
See application file for complete search history.

(56) References Cited

U.S. PATENT DOCUMENTS 6,316,792 B1 * 11/2001 Okazaki et al. ............... 257/99
6,627,922 B1 * 9/2003 Ishinaga ....................... 257/99

FOREIGN PATENT DOCUMENTS

| JP | 57-175453 | 4/1981 |
|----|-----------|--------|
| JP | 4-186688 | 7/1992 |
| JP | 11-284098 | 10/1999 |

\* cited by examiner

*Primary Examiner*—Wai-Sing Louie
(74) *Attorney, Agent, or Firm*—Nixon & Vanderhye P.C.

(57) ABSTRACT

A semiconductor light emitting apparatus includes a non-conductive sub mount; a metal layer provided on the sub mount; a solder material member provided on the metal layer; and a semiconductor light emitting device die-bonded to the metal layer by the solder material member. A surface of the metal layer includes a solder material attachment area having the solder material member attached thereto, and a metal layer exposed area where the surface of the metal layer is exposed. The solder material attachment area is electrically connected to the metal layer exposed area. The solder material attachment area is larger than a die-bond area of the semiconductor light emitting device. The metal layer exposed area has a metal layer removed area therein where the sub mount is exposed.

9 Claims, 9 Drawing Sheets

SEMICONDUCTOR LIGHT EMITTING APPARATUS AND METHOD FOR PRODUCING THE SAME

This non-provisional application claims priority under 35 U.S.C., §119(a), on Patent Application Ser. No. 2003-142551 filed in Japan on May 20, 2003 and patent application Ser. No. 2004-122352 filed in Japan on Apr. 16, 2004, the entire contents of which are hereby incorporated by reference.

BACKGROUND OF THE INVENTION

1. Field of the Invention

The present invention relates to a semiconductor light emitting apparatus and a method for producing the same.

2. Description of the Related Art

Usually in a semiconductor laser device used as a light source for an optical disc apparatus, a semiconductor laser device is die-bonded to a metal layer on a sub mount.

Figure 9A:
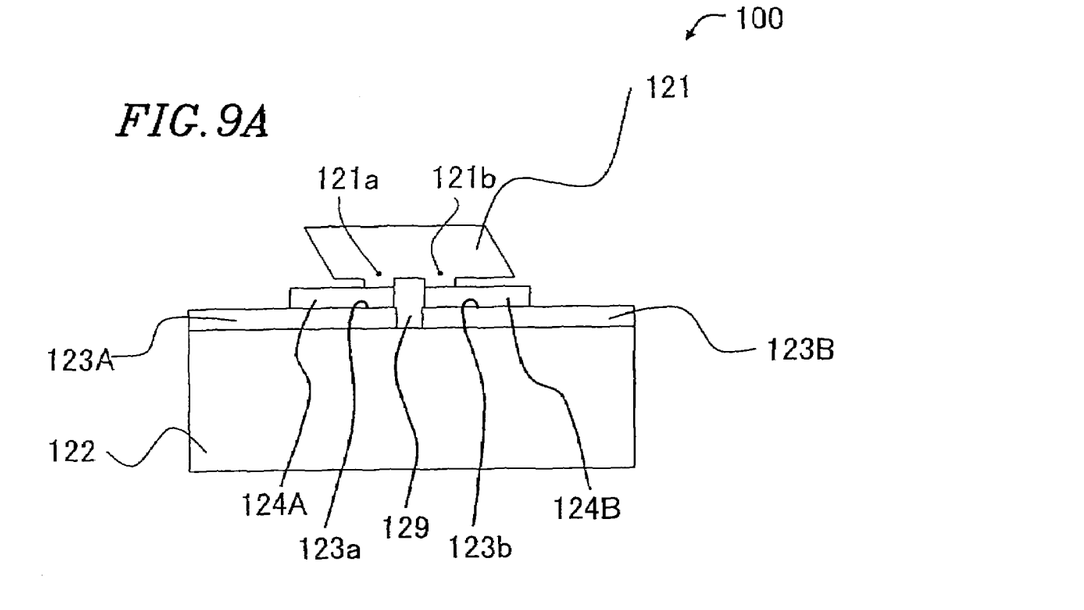
FIG. 9A is a schematic cross-sectional view of a conventional semiconductor laser apparatus.
Figure 9B:
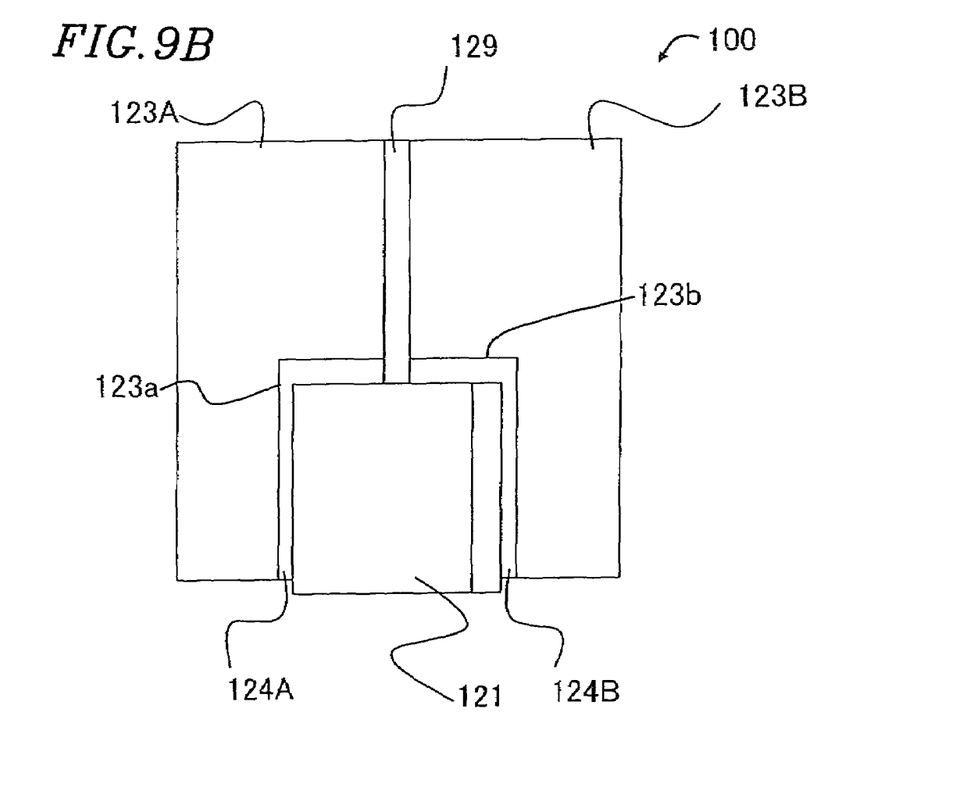
FIG. 9B is a schematic plan view thereof.

FIG. 9A is a schematic cross-sectional view of a conventional semiconductor laser apparatus 100, and FIG. 9B is a schematic plan view thereof.

In the semiconductor laser apparatus 100, a pair of metal layers 123 including a metal layer 123A and a metal layer 123B are provided on a surface of a rectangular parallelepiped sub mount 122 formed of a non-conductive material. A semiconductor laser device 121 is die-bonded to the metal layer 123A and the metal layer 123B respectively by a solder material member 124A and a max material member 124B.

The metal layers 123A and 123B have a similar rectangular shape, and are electrically separated from each other by a separation area 129 linearly defined on a central area of a surface of the sub mount 122. The separation area 129 has a prescribed width. The metal layers 123A and 123B cover the entire surface of the sub mount 122 except for the separation area 129. In the separation area 129, the surface of the sub mount 122 is exposed.

A solder material attachment area 123a is a rectangular area extending in a longitudinal direction of the metal layer 123A from one end of the metal layer 123A. The solder material attachment area 123a is also adjacent to the separation area 129. To the solder material attachment area 123a, the solder material member 124A is attached. A solder material attachment area 123b is a rectangular area extending in a longitudinal direction of the metal layer 123B from one end of the metal layer 123B. The solder material attachment area 123b is also adjacent to the separation area 129. To the solder material attachment area 123b, the solder material member 124B is attached. The solder material attachment area 123a and the solder material attachment area 123b are located to face each other with the separation area 129 interposed therebetween.

The semiconductor laser device 121 is bridged over the separation area 129 at one end portion thereof in the longitudinal direction, and is located above the metal layers 123A and 123B.

The semiconductor laser device 121 includes a semiconductor layer (not shown) provided on a substrate (not shown), two light emitting points 121a and 121b in an upper portion of the semiconductor layer, and an electrode (not shown) above each of the light emitting points 121a and 121b. The electrodes are provided for applying a supply voltage. Then, the semiconductor laser device 121 is positioned such that the electrode above the light emitting point 121a and the electrode above the light emitting point 121b respectively contact the solder material members 124A and 124B, and such that the substrate of the semiconductor laser device 121 is located in an upper portion of the semiconductor laser apparatus 100. The substrate of the semiconductor laser device 121 is provided with an electrode (not shown) for applying aground voltage.

To the electrode provided to the substrate of the semiconductor laser device 121, a wire (not shown) which is electrically connected to the ground (ground voltage) is wire-bonded. To each of the metal layers 123A and 123B, a wire (not shown) electrically connected to the supply voltage is wire-bonded.

The solder material member 124A is located on the rectangular solder material attachment area 123a of the metal layer 123A along the separation area 129, and the solder material member 124B is located on the rectangular solder material attachment area 123b of the metal layer 123B along the separation area 129. A total area of the solder material attachment areas 123a and 123b is larger than a die-bond area of the semiconductor laser device 121 (i.e., a total area of the bottom surface of the semiconductor laser device 121 facing the solder material attachment areas 123a and 123b).

The semiconductor laser device 121 is die-bonded in the following manner.

The solder material member 124A is located on the solder material attachment area 123a of the metal layer 123A, and the solder material member 124B is located on the solder material attachment area 123b of the metal layer 123B. Next, the semiconductor laser device 121 is located on the solder material members 124A and 124B. Then, the solder material members 124A and 124B are heated to be melted, and the semiconductor laser device 121 is die-bonded to the metal layers 123A and 123B by the melted solder material members 124A and 124B.

The semiconductor laser apparatus 100 is required to cause the semiconductor laser device 121 to stably operate even at a very high temperature. In order to realize this, it is necessary to efficiently diffuse heat by the sub mount 122. This can be realized by increasing the amount of the solder material of the solder material members 124A and 124B to improve the adhesiveness between the semiconductor laser device 121 and the sub mount 122, and thus to reduce the heat resistance between the semiconductor laser device 121 and the sub mount 122.

Figure 10A:
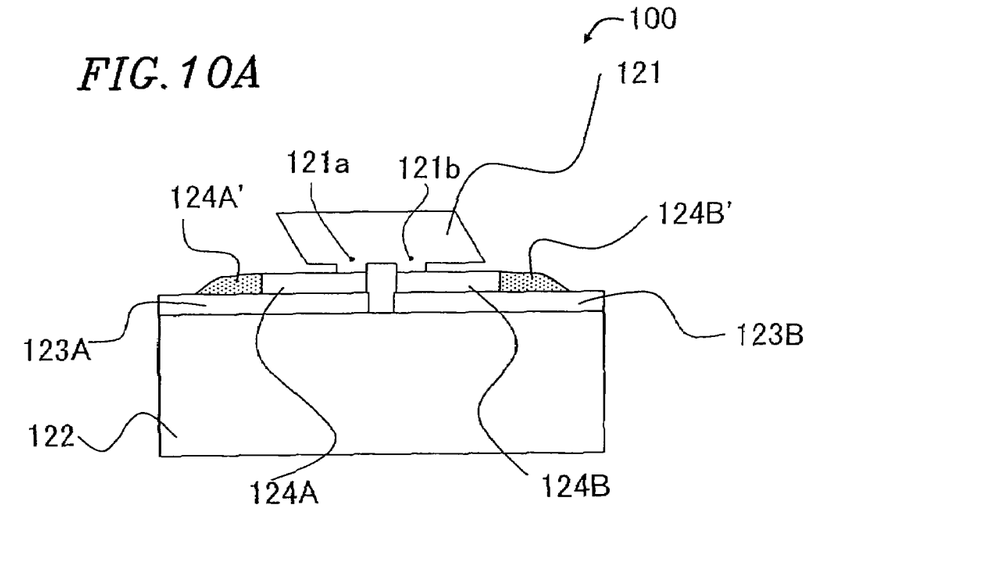
FIG. 10A is a schematic cross-sectional view of the conventional semiconductor laser apparatus, illustrating a state where the solder material is expanded.
Figure 10B:
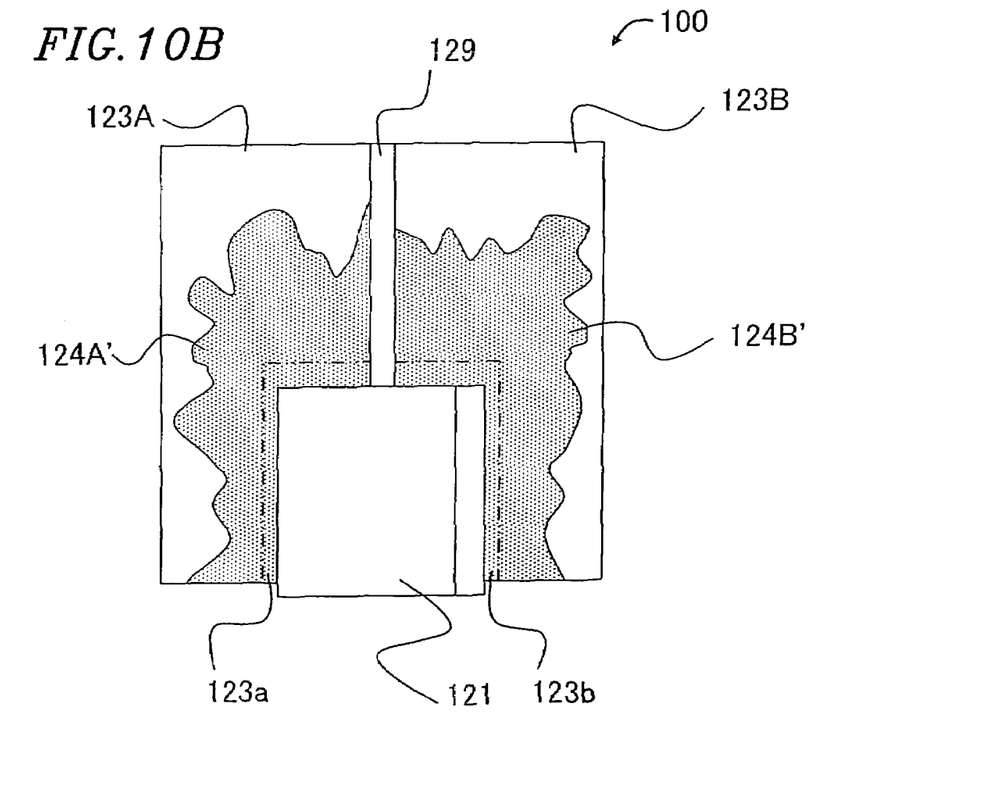
FIG. 10B is a schematic plan view thereof.

However, when the amount of solder material of the solder material members 124A and 124B is increased, the state shown in FIGS. 10A and 10B occurs. More specifically, when the semiconductor laser device 121 is die-bonded to the metal layers 123A and 123B, the melted solder material members (represented by reference numeral 124A' and 124B') flow to the vicinity of the solder material attachment areas 123a and 123b. As a result, a large area of the surface of the metal layers 123A and 123B is covered with the melted solder material members 124A' and 124B'. When this occurs, the area of the metal layers 123A and 123B bonded to the wires is reduced, which makes the wire-bonding work difficult.

The semiconductor laser apparatus 100 is picked up using a collet having a recess in which the semiconductor laser device 121 can fit.

For picking up the semiconductor laser apparatus 100 using such a collet, the collet needs to adhere to a surface of the metal layers 123A and 123B. Where a large area of the metal layers 123A and 123B is covered with the melted solder material members 124A' and 124B' as shown in FIGS. 10A and 10B, the collet cannot adhere to the surface of the metal layers 123A and 123B. In this case, the semiconductor laser apparatus 100 may not be picked up.

Japanese Laid-Open Publication No. 4-186688 discloses a semiconductor laser apparatus in which the sub mount is formed of a material having no wettability with respect to the melt-adhesion metal (for example, the solder material) except for an melt-adhesion area of the die-bond surface of the sub mount. Thus, the melt-adhesion area does not protrude from the die-bond surface of the semiconductor laser chip (semiconductor laser device).

Japanese Laid-Open Publication No. 11-284098 discloses a semiconductor laser apparatus in which the area to which the solder material is to adhere is smaller than the die-bond area of the laser chip and the sub mount. Thus, the solder material does not protrude from the die-bond surface of the laser chip.

In the semiconductor laser apparatuses disclosed in Japanese Laid-Open Publications Nos. 4-186688 and 11-284098, the solder material is provided so as not to protrude from the die-bond area of the semiconductor laser device. However, when the area in which the solder material is provided is smaller than the die-bond area, the amount of the solder material cannot be increased, and thus the heat resistance between the semiconductor laser device and the sub mount cannot be reduced. As a result, the semiconductor laser device cannot be operated at a high temperature.

Japanese Laid-Open Publication No. 11-284098 discloses a structure in which a groove is provided so as to surround the area to which the solder material is to adhere, inner to the outer perimeter of the laser chip. In this case also, the area for the solder material is limited to the inside of the die-bond area of the laser chip. Therefore, the amount of the solder material cannot be increased, and the laser chip cannot be stably operated at a high temperature.

SUMMARY OF THE INVENTION

According to one aspect of the invention, a semiconductor light emitting apparatus includes a non-conductive sub mount; a metal layer provided on the sub mount; a solder material member provided on the metal layer; and a semiconductor light emitting device die-bonded to the metal layer by the solder material member. A surface of the metal layer includes a solder material attachment area having the solder material member attached thereto, and a metal layer exposed area where the surface of the metal layer is exposed. The solder material attachment area is electrically connected to the metal layer exposed area. The solder material attachment area is larger than a die-bond area of the semiconductor light emitting device. The metal layer exposed area has a metal layer removed area therein where the sub mount is exposed.

In one embodiment of the invention, the solder material attachment area is distanced from the metal layer removed area by a prescribed distance.

In one embodiment of the invention, the metal layer removed area is L-shaped, I-shaped, generally U-shaped, V-shaped or arc-shaped.

In one embodiment of the invention, the semiconductor light emitting apparatus further includes a wire which is wire-bonded to the metal layer exposed area via a wire-bonding section, such that the metal layer removed area is located between the wire-bonding section and the solder material attachment area.

In one embodiment of the invention, the sub mount is formed of a material having a high heat conductivity and a low wettability with respect to a solder material of the solder material member.

In one embodiment of the invention, the sub mount is formed of SiC, AlN or sapphire.

In one embodiment of the invention, the metal layer includes a Ti layer, a Pt layer or a Ni layer, and an Au layer which are laminated in this order from a surface of the sub mount.

In one embodiment of the invention, the semiconductor light emitting device has at least one light emitting point.

In one embodiment of the invention, the semiconductor light emitting apparatus further includes another semiconductor light emitting device.

According to another aspect of the invention, a method for producing a semiconductor light emitting apparatus includes the steps of providing a non-conductive submount having a metal layer provided on a surface thereof, wherein a surface of the metal layer includes a metal layer exposed area and a solder material attachment area, and the metal layer exposed area has a metal layer removed area therein where the sub mount is exposed; attaching a solder material member to the solder material attachment area; and die-bonding a semiconductor light emitting device to the metal layer by the solder material member.

In one embodiment of the invention, the method further includes the step of wire-bonding a wire via a wire-bonding section after the semiconductor light emitting device is die-bonded, such that the metal layer removed area is located between the wire-bonding section and the solder material attachment area.

In one embodiment of the invention, the step of wire-bonding includes the step of detecting a position of the metal layer removed area by image recognition so as to specify a position of the metal layer and adjusting a position of the wire.

In one embodiment of the invention, the method further includes the step of detecting a position of the metal removed area by image recognition so as to specify a position of the metal layer and adjusting a position of the sub mount, after the step of die-bonding.

In one embodiment of the invention, the method further includes the step of causing a surface of a collet having a recess, to which the semiconductor light emitting device is to fit, to adhere to the metal layer exposed area so as to pick up the semiconductor light emitting device, after the step of die-bonding.

According to the present invention, the solder material attachment area of the metal layer which is provided on the surface of the non-conductive sub mount is larger than the die-bond area of the semiconductor light emitting device. Therefore, the amount of the solder material used for die-bonding the semiconductor light emitting device to the metal layer can be increased. This reduces the heat resistance between the semiconductor light emitting device and the sub mount via the metal layer, which allows the semiconductor light emitting device to stably operate even at a high temperature.

When the amount of the solder material is merely increased, the solder material may flow into a large area when the semiconductor light emitting device is die-bonded to the metal layer. However, according to the present invention, the metal layer exposed area has the metal layer removed area therein where the surface of the sub mount is exposed. Therefore, the solder material is prevented from flowing. As a result, the metal layer exposed area can be effectively used for wire-bonding, picking-up of the semiconductor light emitting device by a collet, and the like.

According to a semiconductor light emitting apparatus and a method for producing the same of the present invention, the solder material attachment area of the metal layer is larger than a die-bond area of the semiconductor light emitting device. Therefore, the amount of the solder material used for die-bonding the semiconductor light emitting device to the metal layer can be increased. This reduces the heat resistance between the semiconductor light emitting device and the sub mount via the metal layer, which allows the semiconductor light emitting device to stably operate even at a high temperature. In addition, according to the present invention, the solder material is prevented from flowing to a large area by the metal layer removed area, and therefore does not obstruct the operations of wire-bonding, picking-up of the semiconductor light emitting device by a collet, and the like.

Thus, the invention described herein makes possible the advantages of providing a semiconductor light emitting apparatus and a method for producing the same, by which the amount of the solder material for die-bonding the metal layer provided on the sub mount and the semiconductor light emitting device is increased, so that the apparatus is stably operated even at a high temperature, while preventing adverse effects caused by the increase in the amount of the solder material.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

In the following description, a semiconductor laser apparatus using a semiconductor laser device will be described as an example of the semiconductor light emitting apparatus, but the present invention is not limited to a semiconductor laser apparatus. The present invention is applicable to any semiconductor light emitting apparatus in which a semiconductor light emitting device is die-bonded to a metal layer by a solder material.

Figure 1A:
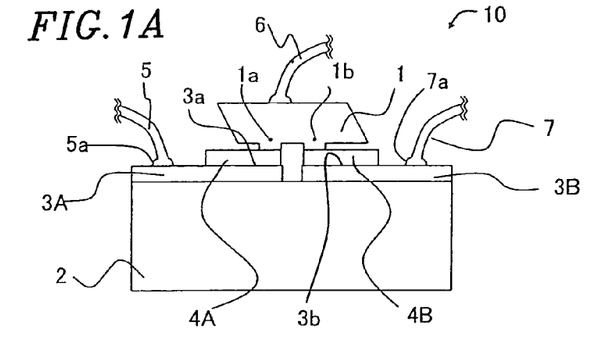
FIG. 1A is a schematic cross-sectional view of a semiconductor laser apparatus in one example according to the present invention.
Figure 1B:
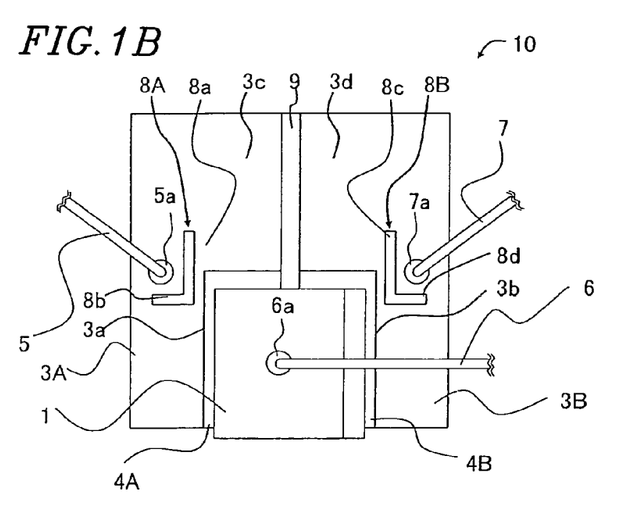
FIG. 1B is a schematic plan view thereof.
Figure 1C:
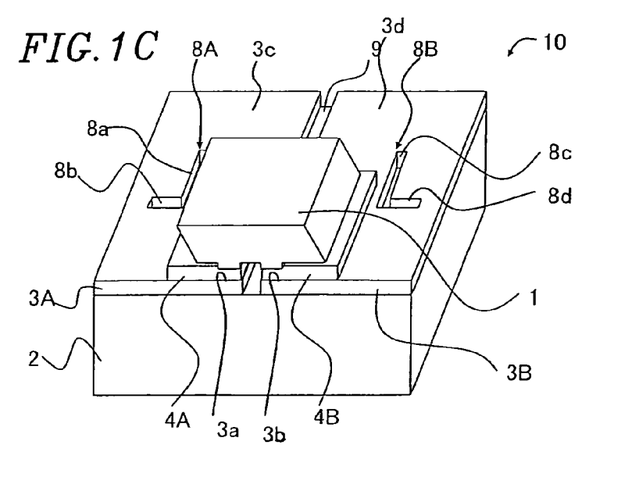
FIG. 1C is a schematic isometric view thereof.

FIG. 1A is a schematic cross-sectional view of a semiconductor laser apparatus 10 in an example of the present invention, FIG. 1B is a schematic plan view thereof, and FIG. 1C is a schematic isometric view thereof.

In the semiconductor laser apparatus 10, a pair of metal layers 3 including a metal layer 3A and a metal layer 3B are provided on a surface of a rectangular parallelepiped sub mount 2 formed of a non-conductive material. A semiconductor laser device 1 is die-bonded to the metal layers 3A and 3B respectively by solder material members 4A and 4B.

The metal layers 3A and 3B have a similar rectangular shape, and are electrically separated from each other by a separation area 9 linearly defined on a central area of the surface of the sub mount 2. The separation area 9 has a prescribed width. The metal layers 3A and 3B cover the entire surface of the sub mount 2 except for the separation area 9 and metal layer removed areas 8A and 8B. In the separation area 9 and the metal layer removed areas 8A and 8B, the surface of the sub mount 2 is exposed.

A solder material attachment area 3a is a rectangular area extending in a longitudinal direction of the metal layer 3A from one end of the metal layer 3A. The solder material attachment area 3a is also adjacent to the separation area 9. To the solder material attachment area 3a, the solder material member 4A is attached. A solder material attachment area 3b is a rectangular area extending in a longitudinal direction of the metal layer 3B from one end of the metal layer 3B. The solder material attachment area 3b is also adjacent to the separation area 9. To the solder material attachment area 3b, the solder material member 4B is attached. The solder material attachment area 3a and the solder material attachment area 3b are located to face each other with the separation area 9 interposed therebetween.

The semiconductor laser device 1 acting as a semiconductor light emitting device is bridged over the separation area 9 at one end portion in the longitudinal direction thereof, and is located above the metal layers 3A and 3B.

The semiconductor laser device 1 includes a semiconductor layer (not shown) provided on a substrate (not shown), two light emitting points 1a and 1b in an upper portion of the semiconductor layer, and an electrode (not shown) above each of the light emitting points 1a and 1b. The electrodes are provided for applying a supply voltage. Then, the semiconductor laser device 1 is positioned such that the electrode above the light emitting point 1a and the electrode above the light emitting point 1b respectively contact the solder material members 4A and 4B, and such that the substrate of the semiconductor laser device 1 is located in an upper portion of the semiconductor laser apparatus 10. The substrate of the semiconductor laser device 1 is provided with an electrode (not shown) for applying a ground voltage.

The solder material member 4A is located on the rectangular solder material attachment area 3a of the metal layer 3A along the separation area 9, and the solder material member 4B is located on the rectangular solder material attachment area 3b of the metal layer 3B along the separation area 9.

A total area of the solder material attachment areas 3a and 3b is larger than a die-bond area of the semiconductor laser device 1 (i.e., a total area of the bottom surface of the semiconductor laser device 1 facing the solder material attachment areas 3a and 3b). The length of each of the solder material attachment areas 3a and 3b in the longitudinal direction is about ½ of the length of the separation area 9 in the longitudinal direction, i.e., about ½ of the length of each of the metal layers 3A and 3B in the longitudinal direction. The length of each of the solder material attachment areas 3a and 3b in the width direction is about ½ of the length of each of the metal layers 3A and 3B in the width direction. The width direction of the solder material attachment areas 3a and 3b and the metal layers 3A and 3B is substantially perpendicular to the longitudinal direction of, for example, the separation area 9.

The metal layer 3A includes a metal layer exposed area 3c in the vicinity of the solder material attachment area 3a. The metal layer exposed area 3c is electrically connected to the solder material attachment area 3a.

Similarly, the metal layer 3B includes a metal layer exposed area 3d in the vicinity of the solder material attachment area 3b. The metal layer exposed area 3d is electrically connected to the solder material attachment area 3b.

To the electrode provided to the substrate of the semiconductor laser device 1, a wire 6 electrically connected to the ground (ground voltage) is wire-bonded via a wire-bonding section 6a at one end of the wire 6.

To the metal layer exposed area 3c of the metal layer 3A, a wire 5 electrically connected to the supply voltage is wire-bonded via a wire-bonding section 5a at one end of the wire 5. To the metal layer exposed area 3d of the metal layer 3B, a wire 7 electrically connected to the supply voltage is wire-bonded via a wire-bonding section 7a at one end of the wire 7.

The wire-bonding section 5a connected to the metal layer exposed area 3c is located in the vicinity of a corner of the solder material attachment area 3a, the corner being at a center of the metal layer 3A in the longitudinal direction. Similarly, the wire-bonding section 7a connected to the metal layer exposed area 3d is located in the vicinity of a corner of the solder material attachment area 3b, the corner being at a center of the metal layer 3B in the longitudinal direction.

The metal layer removed area 8A is provided in the metal layer exposed area 3c of the metal layer 3A and in the vicinity of the wire-bonding section 5a. The metal layer removed area 8A is formed by partially removing the metal layer 3A. Similarly, the metal layer removed area 8B is provided in the metal layer exposed area 3d of the metal layer 3B and in the vicinity of the wire-bonding section 7a. The metal layer removed area 8B is formed by partially removing the metal layer 3B.

The metal layer removed area 8A includes (i) a first linear portion 8a which is provided between the wire-bonding section 5a and the corner of the solder material attachment area 3a in the vicinity of the wire-bonding section 5a and is parallel to the separation area 9, and (ii) a second linear portion 8b connected to, and projected from, one end of the first linear portion 8a at a right angle in a direction away from the separation area 9. The first linear portion 8a and the second linear portion 8b form an L-shape.

The metal layer removed area 8A is provided between the wire-bonding section 5a and the solder material attachment area 3a.

The first linear portion 8a does not reach a perimeter of the metal layer 3A, and therefore the solder material attachment area 3a is electrically connected to an area of the metal layer exposed area 3c in which the wire-bonding section 5a is provided.

The metal layer removed area 8B includes (i) a first linear portion 8c which is provided between the wire-bonding section 7a and the corner of the solder material attachment area 3b in the vicinity of the wire-bonding section 7a and is parallel to the separation area 9, and (ii) a second linear portion 8d connected to, and projected from, one end of the first linear portion 8c at a right angle in a direction away from the separation area 9. The first linear portion 8c and the second linear portion 8d form an L-shape.

The metal layer removed area 8B is provided between the wire-bonding section 7a and the solder material attachment area 3b.

The first linear portion 8c does not reach a perimeter of the metal layer 3B, and therefore the solder material attachment area 3b is electrically connected to an area of the metal layer exposed area 3d in which the wire-bonding section 7a is provided.

The sub mount 2 is formed of, for example, SiC, which has a high heat conductivity and a low wettability with respect to the solder material members 4A and 4B.

The metal layers 3A and 3B are formed by, for example, laminating a Ti layer, a Pt layer and an Au layer in this order from the surface of the sub mount 2. The Ti layer has a good adherence with the sub mount 2. The Pt layer has a good heat resistance. The Au layer has a good wettability with the solder material members 4A and 4B. The Pt layer may be replaced with a Ni layer, which is less costly than the Pt layer. In this case, the Ti layer, the Ni layer and the Au layer may be laminated from the surface of the sub mount 2 in this order.

The semiconductor laser device 1 is die-bonded in the following manner.

The pair of metal layers 3 including the metal layer 3A and the metal layer 3B having the L-shaped metal layer removed areas 8A and 8B are formed on the surface of the sub mount 2, such that the metal layer 3A and the metal layer 3B are separated from each other by the separation area 9. Next, the solder material member 4A is located on the solder material attachment area 3a of the metal layer 3A, and the solder material member 4B is located on the solder material attachment area 3b of the metal layer 3B. On the solder material members 4A and 4B, the semiconductor laser device 1 is provided. Then, the solder material members 4A and 4B are heated to be melted, and the semiconductor laser device 1 is die-bonded to the metal layers 3A and 3B by the melted solder material members 4A and 4B.

As described above, for die-bonding the semiconductor laser device 1 to the metal layers 3A and 3B by the solder material members 4A and 4B, the solder material members 4A and 4B are heated. As a result, the solder material members 4A and 4B are melted and flow to the vicinity thereof. The solder material members 4A and 4B respectively reach the metal layer removed areas 8A and 8B of the metal layers 3A and 3B. The metal layer removed area 8A exposing the surface of the sub mount 2 prevents the melted solder material member 4A from flowing furthermore, since the surface of the sub mount 2 does not have wettability with respect to the solder material member 4A. Thus, the melted solder material member 4A is prevented from flowing to an area of the metal layer exposed area 3c in which the wire-bonding section 5a is provided. Similarly, the metal layer removed area 8B prevents the melted solder material member 4B from flowing furthermore, since the surface of the sub mount 2 does not have wettability with respect to the solder material member 4B. Thus, the melted solder material member 4B is prevented from flowing to an area of the metal layer exposed area 3d in which the wire-bonding section 7a is provided.

After the semiconductor laser device 1 is die-bonded to the metal layers 3A and 3B by the solder material members 4A and 4B as described above, the wire 5 is wire-bonded to a prescribed area of the metal layer exposed area 3c in the vicinity of the metal layer removed area 8A via the wire-bonding section 5a. The melted solder material member 4A does not flow to the area of the metal layer exposed area 3c to which the wire-bonding section 5a is to be connected. Therefore, the wire 5 can be connected to this area via the wire-bonding section 5a with certainty.

Similarly, after the semiconductor laser device 1 is die-bonded, the wire 7 is wire-bonded to a prescribed area of the metal layer exposed area 3d in the vicinity of the metal layer removed area 8B via the wire-bonding section 7a. The melted solder material member 4B does not flow to the area of the metal layer exposed area 3d to which the wire-bonding section 7a is to be connected. Therefore, the wire 7 can be connected to this area via the wire-bonding section 7a with certainty.

Next, the wire 6 is wire-bonded to the substrate (not shown) of the semiconductor laser device 1 via the wire-bonding section 6a.

In such wire-bonding, detection of the position of the wire-bonding by image recognition is often performed. In this case, the metal layer removed area 8A or 8B can be used as a mark for detecting the position of the wire-bonding. In this manner, the wires 5, 6 and 7 can be located to their respective positions accurately and easily.

For adjusting the position of the sub mount 2 by image recognition, the metal layer removed area 8A or 8B can be used as a mark for detecting the position of the sub mount 2.

In either case, the detection of the positions and the like by image recognition can be performed easily by forming the metal layer removed area 8A or 8B to be large.

Figure 2:
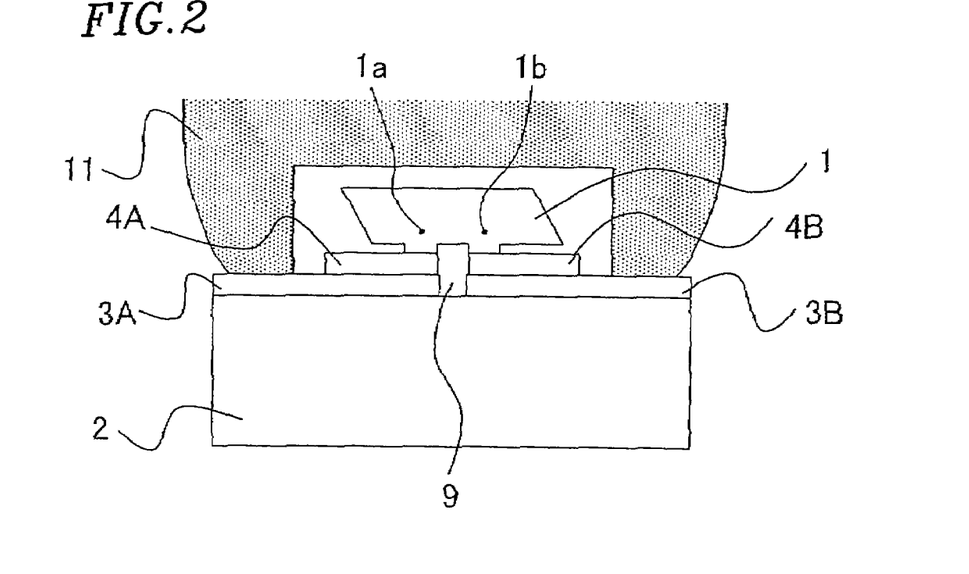
FIG. 2 is a schematic cross-sectional view illustrating an operation of picking up a semiconductor laser device according to the present invention using a collet.

FIG. 2 is a schematic cross-sectional view illustrating an operation of picking up the semiconductor laser apparatus 10 in the example according to the present invention using a collet 11.

As shown in FIG. 2, the collet 11 has a recess in which the semiconductor laser device 1 can fit. As described above, the melted solder material members 4A and 4B do not flow to the majority of the metal layer exposed areas 3c and 3d of the metal layers 3A and 3B. Therefore, when picking up the semiconductor laser apparatus 10 by the collet 11, the surface of the collet 11 can adhere to the metal layer exposed areas 3c and 3d. Thus, the semiconductor laser apparatus 10 can be easily picked up and moved by the collet 11.

It is preferable that the metal material attachment area 3a is a certain distance away from the metal layer removed area 8A, and that the metal material attachment area 3b is a certain distance away from the metal layer removed area 8B.

Figure 3:
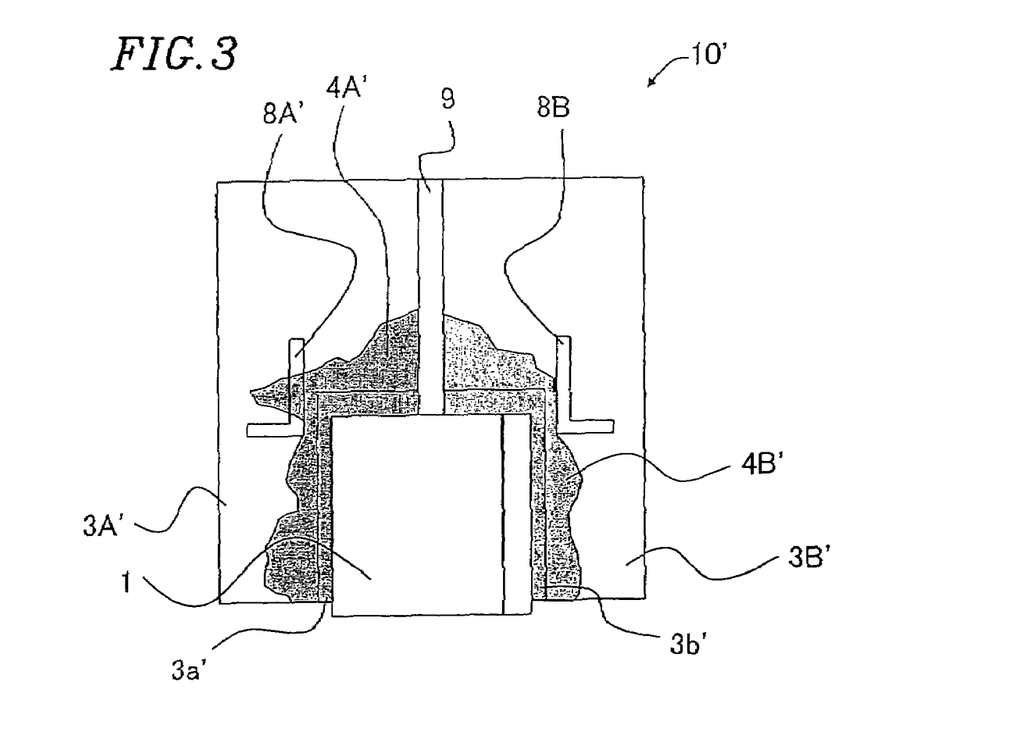
FIG. 3 is a schematic plan view of a semiconductor laser apparatus in another example according to the present invention.

FIG. 3 is a schematic plan view of a semiconductor laser apparatus 10' in another example according to the present invention. In the semiconductor laser apparatus 10', the distance between a solder material attachment area 3a' and a metal layer removed area 8A' is relatively short, and the distance between a solder material attachment area 3b' and a metal layer removed area 8B' is also relatively short. In the case where the distance between the solder material attachment area 3a' and the metal layer removed area 8A' is short, a sufficient space for a melted solder material member 4A' to move is not obtained. As a result, the melted solder material member 4A' may be raised on the surface of the metal layer 3A' or flow over the metal layer removed area 8A'.

Figure 4:
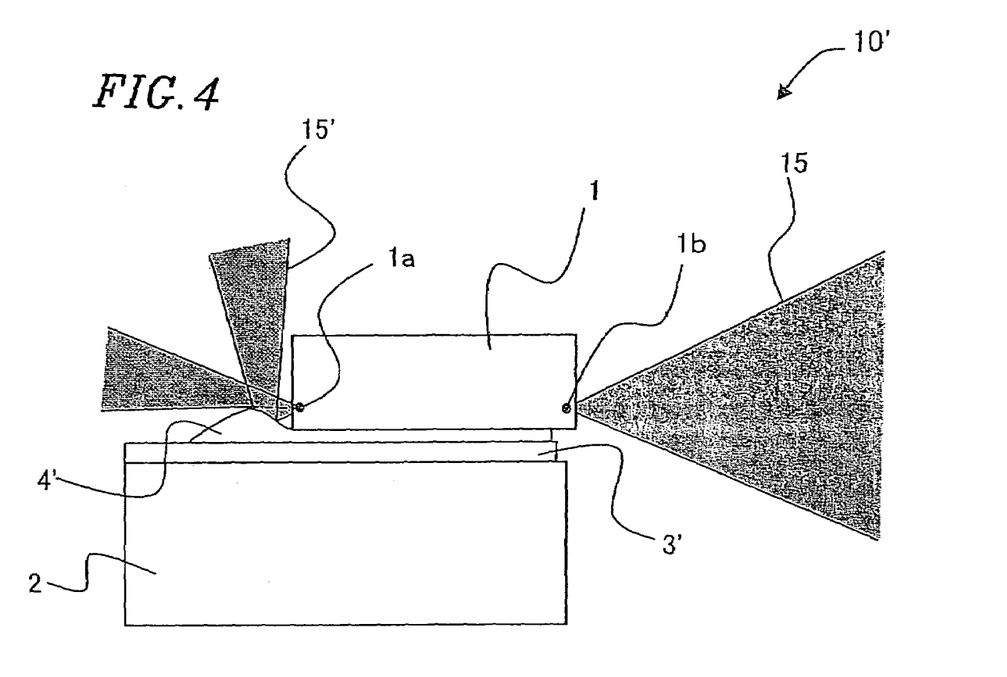
FIG. 4 is a schematic cross-sectional view of the semiconductor laser apparatus shown in FIG. 3.

FIG. 4 is a schematic cross-sectional view of the semiconductor laser apparatus 10'.

In FIG. 4, light 15 emitted from the light emitting point 1b is normally conveyed, but light 15' emitted from the emitting point 1a is reflected by the raised solder material member 4A' to an unintended direction.

Figure 5:
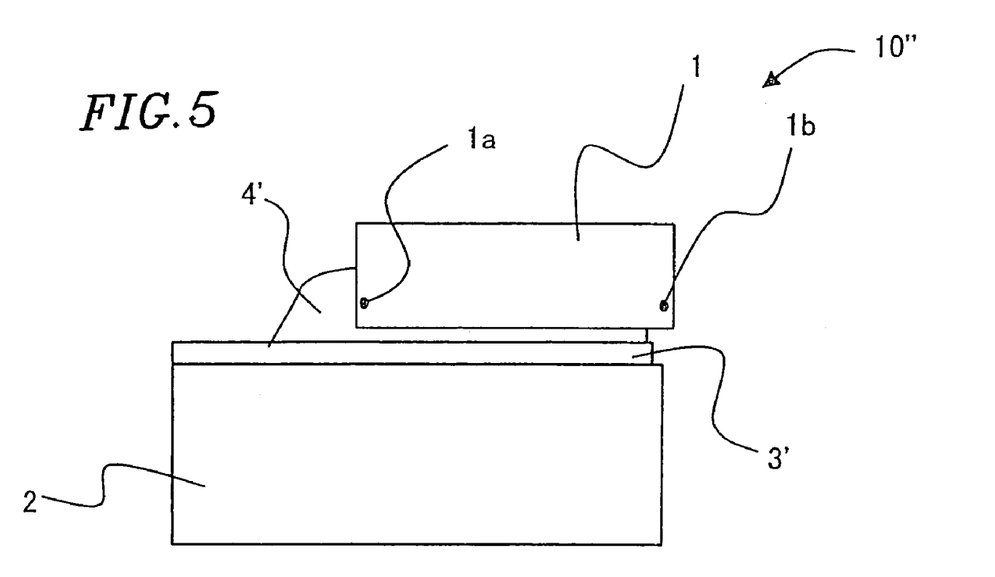
FIG. 5 is a schematic cross-sectional view of a semiconductor laser apparatus in still another example according to the present invention.

FIG. 5 is a schematic cross-sectional view of a semiconductor laser apparatus 10'' in still another example of the present invention.

In FIG. 5, the raised solder material member 4A' adheres to the semiconductor laser device 1. In such a case, portions of the semiconductor laser device 1 which should be insulated from each other may be electrically connected to each other by the raised solder material member 4A', resulting in electric shortcircuiting.

Accordingly, it is preferable that the distance between the solder material attachment area 3a and the metal layer removed area 8A is a prescribed distance or greater, and that the distance between the solder material attachment area 3b and the metal layer removed area 8B is a prescribed distance or greater.

In the above examples, the semiconductor laser device 1 having two light emitting points 1a and 1b is used. The present invention is not limited to this. The semiconductor laser device used in the present invention may have, one, or three or more light emitting points. The present invention is not limited to a semiconductor laser device, but maybe applied to any semiconductor light emitting device.

FIGS. 6A through 6D are schematic cross-sectional views of semiconductor laser apparatuses in various other examples according to the present invention.

Figure 6A:
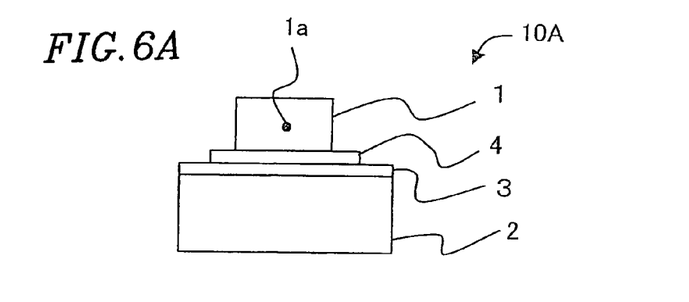
FIGS. 6A through 6D are schematic cross-sectional views of semiconductor laser apparatuses in various other examples according to the present invention.

FIG. 6A is a schematic cross-sectional view of a semiconductor laser apparatus 10A. The semiconductor laser apparatus 10A has the same structure as that of the semiconductor laser apparatus 10 shown in FIG. 1 except that the semiconductor laser device 1 has one light emitting point.

Figure 6B:
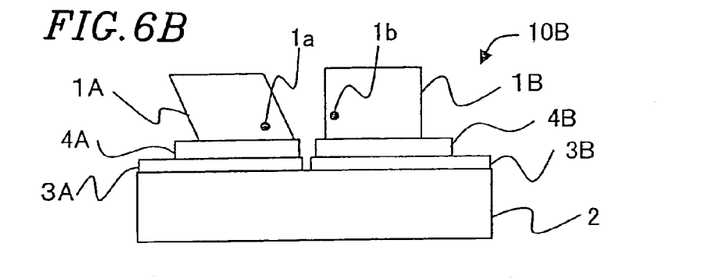

FIG. 6B is a schematic cross-sectional view of a semiconductor laser apparatus 10B. The semiconductor laser apparatus 10B has the same structure as that of the semiconductor laser apparatus 10 shown in FIG. 1 except for the following. The semiconductor laser apparatus 10B includes a semiconductor laser device 1A having one light emitting point 1a and a semiconductor laser device 1B having one light emitting point 1b. The semiconductor laser device 1A is die-bonded to the metal layer 3A by the solder material member 4A, and the semiconductor laser device 1B is die-bonded to the metal layer 3B by the solder material member 4B.

Figure 6C:
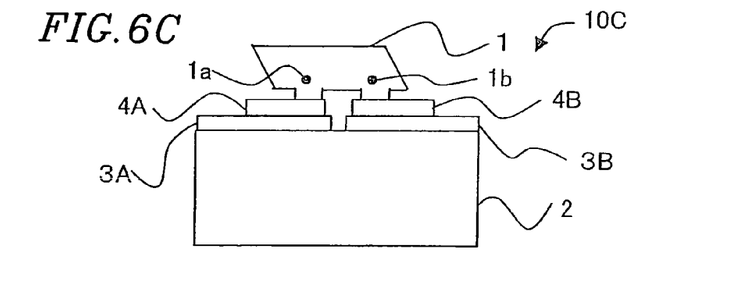

FIG. 6C is a schematic cross-sectional view of a semiconductor laser apparatus 10C. The semiconductor laser apparatus 10C has the semiconductor laser device 1 including two light emitting points 1a and 1b. The semiconductor laser apparatus 10C has a similar structure to that of the semiconductor laser apparatus 10 shown in FIG. 1.

Figure 6D:
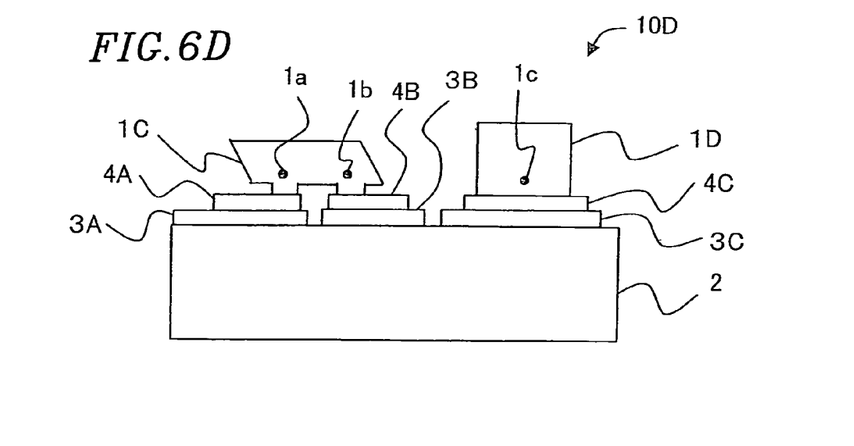

FIG. 6D is a schematic cross-sectional view of a semiconductor laser apparatus 10D. The semiconductor laser apparatus 10D has the same structure as that of the semiconductor laser apparatus 10 shown in FIG. 1 except for the following. The semiconductor laser apparatus 10D includes a semiconductor laser device 1C having two light emitting points 1a and 1b and a semiconductor laser device 1D having one light emitting point 1c. The semiconductor laser device 1C is die-bonded to the metal layers 3A and 3B by the solder material members 4A and 4B, and the semiconductor laser device 1D is die-bonded to a metal layer 3C via a solder material member 4C.

The semiconductor laser apparatus according to the present invention is not limited to including one semiconductor laser device, but may include a plurality of semiconductor laser devices as shown in FIGS. 6B and 6D.

In the above examples, SiC is used as a material of the sub mount 2. The material of the sub mount 2 is not limited to SiC, but maybe any non-conductive material. The material preferably has a high heat conductivity in order to provide a good heat diffusivity, and preferably has a low wettability in order to prevent flowing of the solder material. Such materials include, for example, AlN and sapphire.

In the above examples, the metal layers 3 include the Ti layer, the Pt layer (or the Ni layer) and the Au layer laminated from the surface of the sub mount 2 in this order. The materials of the metal layers 3 are not limited to these, and may be other materials.

In the above examples, the metal layer removed areas formed in the metal layer exposed areas are L-shaped. The present invention is not limited to this, and may be linear, curved, or of any other shape as long as the melted solder material does not flow over the metal layer removed areas.

FIGS. 7A through 7E are schematic plan views illustrating shapes of a metal layer removed area in various examples according to the present invention.

Figure 7A:
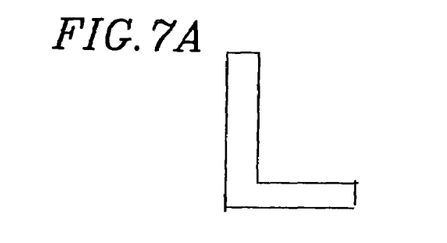
FIGS. 7A through 7E are schematic plan views illustrating various shapes of a metal layer removed area in various examples according to the present invention.
Figure 7B:
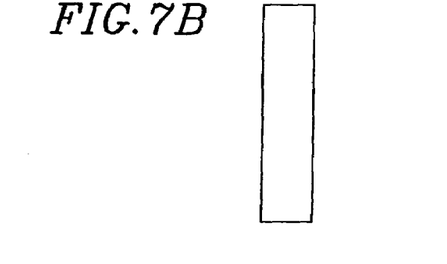
Figure 7C:
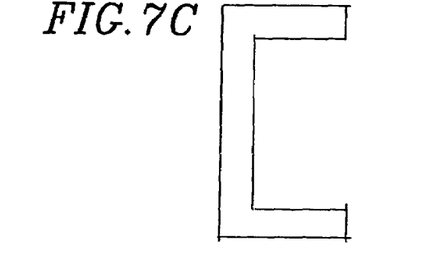
Figure 7D:
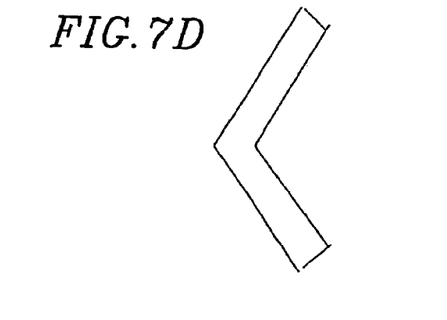
Figure 7E:
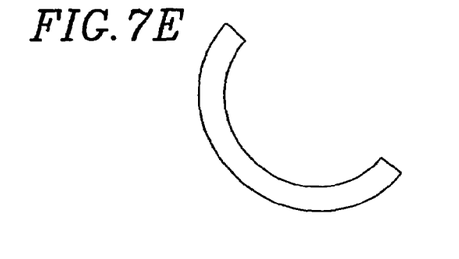

The metal layer removed area may be L-shaped as shown in FIG. 7A, linear or I-shaped as shown in FIG. 7B, generally U-shaped as shown in FIG. 7C, V-shaped as shown in FIG. 7D, or curved (for example, arc-shaped or C-shaped) as shown in FIG. 7E.

Figure 8A:
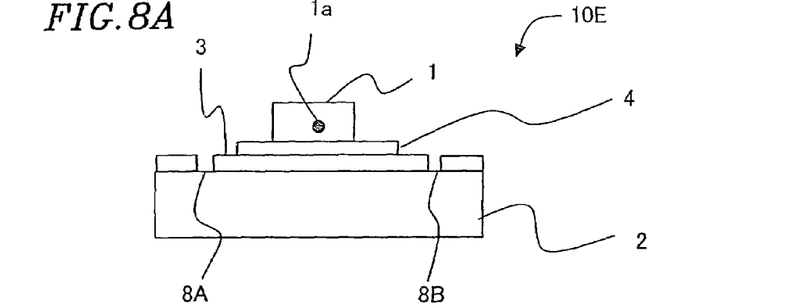
FIG. 8A is a schematic cross-sectional view of a semiconductor laser apparatus in still another example according to the present invention.
Figure 8B:
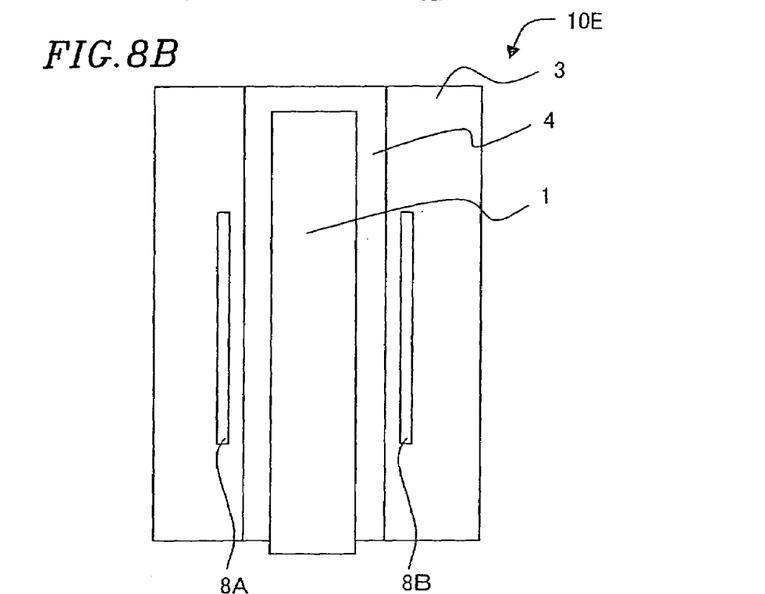
FIG. 8B is a schematic plan view thereof.
Figure 8C:
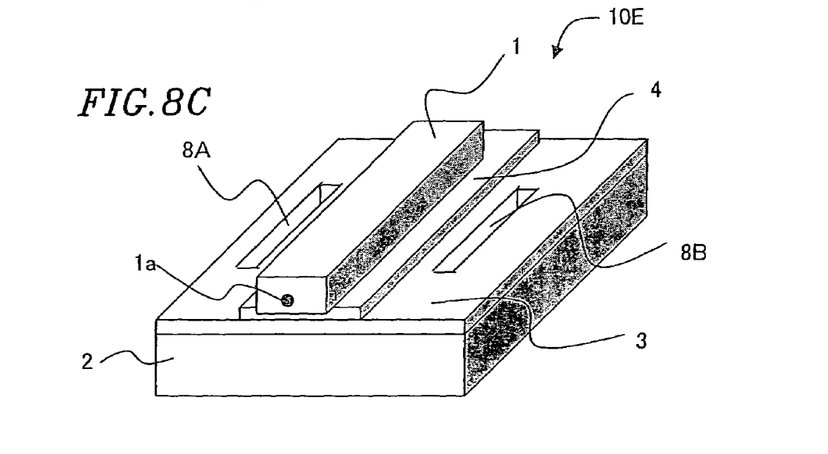
FIG. 8C is a schematic isometric view thereof.

FIG. 8A is a schematic cross-sectional view of a semiconductor laser apparatus 10E in still another example of the present invention, FIG. 8B is a schematic plan view thereof, and FIG. 8C is a schematic isometric view thereof.

The semiconductor laser apparatus 10E has the same structure as that of the semiconductor laser apparatus 10 except that the separation area 9 is not provided and the semiconductor laser device 1 has one light emitting point 1a.

In the above examples, the semiconductor laser apparatuses have a symmetric structure. The present invention is not limited to this. For example, the two metal layer removed areas may not be located symmetrically. Alternatively, there may be only one metal layer removed area.

According to the present invention, the solder material attachment area is formed to be larger than the die-bond area of the semiconductor light emitting device. Therefore, the amount of the solder material used for die-bonding the semiconductor light emitting device to the metal layer can be increased. This reduces the heat resistance between the semiconductor light emitting device and the sub mount via the metal layer. Thus, the semiconductor light emitting device can be stably operated even at a high temperature. Also, the metal layer removed area prevents the solder material from flowing in a large area.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor light emitting apparatus, comprising:
a non-conductive sub mount;
a metal layer provided on the sub mount;
a solder material member provided on the metal layer; and
a semiconductor light emitting device die-bonded to the metal layer by the solder material member;
wherein:
a surface of the metal layer includes a solder material attachment area having the solder material member attached thereto, and a metal layer exposed area where the surface of the metal layer is exposed;
the solder material attachment area is electrically connected to the metal layer exposed area;
the solder material attachment area is larger than a die-bond area of the semiconductor light emitting device; and
a metal layer removed area adjacent the light emitting device is surrounded on all lateral sides thereof by the metal layer.

2. A semiconductor light emitting apparatus according to claim 1, wherein the solder material attachment area is distanced from the metal layer removed area by a prescribed distance.

3. A semiconductor light emitting apparatus according to claim 1, wherein the metal layer removed area is L-shaped, I-shaped, generally U-shaped, V-shaped or arc-shaped.

4. A semiconductor light emitting apparatus according to claim 1, further comprising a wire which is wire-bonded to the metal layer exposed area via a wire-bonding section, such that the metal layer removed area is located between the wire-bonding section and the solder material attachment area.

5. A semiconductor light emitting apparatus according to claim 1, wherein the sub mount is formed of a material having a high heat conductivity and a low wettability with respect to a solder material of the solder material member.

6. A semiconductor light emitting apparatus according to claim 5, wherein the sub mount is formed of SIC, AlN or sapphire.

7. A semiconductor light emitting apparatus according to claim 1, wherein the metal layer includes a Ti layer, a Pt layer or a Ni layer, and an Au layer which are laminated in this order from a surface of the sub mount.

8. A semiconductor light emitting apparatus according to claim 1, wherein the semiconductor light emitting device has at least one light emitting point.

9. A semiconductor light emitting apparatus according to claim 1, further comprising another semiconductor light emitting device.

* * * * *